(12) United States Patent
Kanno

(10) Patent No.: US 6,359,760 B2
(45) Date of Patent: *Mar. 19, 2002

(54) THIN FILM CONDUCTOR LAYER, MAGNETORESISTIVE ELEMENT USING THE SAME AND METHOD OF PRODUCING THIN FILM CONDUCTOR LAYER

(75) Inventor: Hiroyuki Kanno, Niigata-ken (JP)

(73) Assignee: Alps Electric Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/336,300

(22) Filed: Jun. 21, 1999

(30) Foreign Application Priority Data

Jun. 30, 1998 (JP) .............................. 10-184391

(51) Int. Cl.$^7$ .............................. G11B 5/39; G11B 5/127

(52) U.S. Cl. ...................................................... 360/322
(58) Field of Search .............................. 360/322, 324.1, 360/327.24, 327.33

(56) References Cited

U.S. PATENT DOCUMENTS 5,268,806 A    12/1993  Goubau et al. ............. 360/113

*Primary Examiner*—George J. Letscher
(74) *Attorney, Agent, or Firm*—Brinks Hofer Gilson & Lione

(57) ABSTRACT

In a magnetoresistive element, deposition of a conductor layer in a DC magnetron sputtering apparatus causes application of tensile stress to the conductor layer, causing the problem of readily producing separation of the conductor layer. In the present invention, a conductor layer is formed so that the crystal face spacing in the direction perpendicular to the film plane is larger than the crystal face spacing of a bulk material. This permits application of compression stress to the conductor layer, preventing separation of the conductor layer.

13 Claims, 5 Drawing Sheets

THIN FILM CONDUCTOR LAYER, MAGNETORESISTIVE ELEMENT USING THE SAME AND METHOD OF PRODUCING THIN FILM CONDUCTOR LAYER

BACKGROUND OF THE INVENTION

1. Field of the Invention

The present invention relates to a conductor layer, for example, formed in a magnetoresistive element, for example, for detecting an external magnetic field. Particularly, the present invention relates to a thin film conductor layer capable of preventing separation, a magnetoresistive element using the thin film conductor layer, and a method of producing a thin film conductor layer.

2. Description of the Related Art

Magnetoresistive elements include an AMR (anisotropic magnetoresistive) element utilizing anisotropic magnetoresistance, and a GMR (giant magnetoresistive) element utilizing a giant magnetoresistance. A high rate of resistance change can be obtained by a GMR element, as compared with an AMR element.

Of such GMR elements, a spin-valve type thin film element having a relatively simple structure and showing a change in resistance with a weak external magnetic field has the simplest structure comprising four layers including an antiferromagnetic layer, a pinned magnetic layer, a nonmagnetic conductive layer and a free magnetic layer.

FIG. 9 is a sectional view of a conventional spin-valve type thin film element as viewed from the side opposite to a recording medium.

An under layer 6 is made of Ta or the like, and an antiferromagnetic layer 1, a pinned magnetic layer 2, a nonmagnetic conductive layer 3, a free magnetic layer 4, and a protective layer 7 are deposited in turn on the under layer 6. As shown in FIG. 9, the antiferromagnetic layer 1 and the pinned magnetic layer 2 are formed in contact with each other, and the pinned magnetic layer 2 is pinned by an exchange coupling magnetic field generated in the interface between the antiferromagnetic layer 1 and the pinned magnetic layer 2, for example, in the Y direction shown in FIG. 9.

Referring to FIG. 9, hard magnetic bias layers 5 are formed on both sides of the laminate ranging from the under layer 6 to the protective layer 7 so that magnetization of the free magnetic layer 4 is arranged in the X direction shown in the drawing by a bias magnetic field from the hard magnetic bias layers 5.

Further, a main conductive layer 9 is formed on each of the hard magnetic bias layers 5 through an adhesive layer 8, and an adhesive layer (protective layer) 10 is formed on the main conductive layer 9. Hereinafter, the adhesive layers 8 and 10, and the main conductive layers 9 are sometimes referred to as the general term "conductor layer". The adhesive layers 8 and 10 are made of, for example, Cr, W, Nb, or the like, and the main conductive layers 9 are made of α-Ta, Au, Ag, Cu, or the like.

The layers of the above-described conventional spin-valve type thin film element are formed by sputtering or vapor deposition using an existing sputtering apparatus or the like. Particularly a DC magnetron sputtering apparatus exhibiting excellent thickness reproducibility is preferably used as the sputtering apparatus. The DC magnetron sputtering apparatus comprises a substrate and an electrode unit, which are arranged in the apparatus, and a magnet provided in the electrode unit. The electrode unit comprises a DC power source provided therein so that when the DC power source is operated, magnetron discharge is produced due to the relation between an electric field and a magnetic field to sputter a target provided on the electrode unit, to form a thin film (laminate) on the substrate opposite to the target.

However, deposition of the conductor layers of the spin-valve type thin film element by the DC magnetron sputtering apparatus has a problem in which tensile stress is applied to the conductor layers in the direction parallel to the film plane, causing separation of the conductor layers. Since tensile stress is applied to the conductor layers, it is difficult to increase the thickness of the conductor layers to a predetermined value.

Furthermore, in the conventional thin film element, the main conductor layers 9 are made of, for example, Au, Ag, or the like, which is a very soft metallic material. Therefore, when the surface opposite to a recording medium is scratched by dry etching after film deposition to exposure the structure of the spin-valve type thin film element shown in FIG. 9 to the outside, the main conductor layers 9 are sagged to cause a recess in the main conductor layers 9. The occurrence of such sagging undesirably causes, for example, a short-circuit.

SUMMARY OF THE INVENTION

The present invention has been achieved for solving the problems of the conventional element, and an object of the present invention is to provide a thin film conductor layer formed by applying compressive stress thereto for preventing separation of the conductor layer, a magnetoresistive element using the thin film conductor layer, and a method of producing a thin film conductor layer.

The present invention provides a conductor layer comprising a thin film made of a metallic material, wherein the crystal face spacing in the direction perpendicular to the film plane is larger than that of a bulk material made of the same metallic material as the conductor layer in the direction perpendicular to the film plane.

In the present invention, preferably, the metallic material comprises bcc-structure Cr, and the (110) spacing of the conductor layer in the direction perpendicular to the film plane thereof is 2.039 angstroms or more.

Also, an under layer is preferably formed below the thin film conductor layer, which is preferably made of β-phase Ta having (002) face perpendicular to the film plane is.

The present invention also provides a magnetoresistive element comprising a laminate comprising an antiferromagnetic layer, a pinned magnetic layer formed in contact with the antiferromagnetic layer so that the direction of magnetization is pinned by an exchange coupling magnetic field with the antiferromagnetic layer, and a nonmagnetic conductive layer formed between the pinned magnetic layer and a free magnetic layer; and the thin film conductor layer formed on either side of the laminate.

The present invention further provides a magnetoresistive element comprising a laminate comprising a magnetoresistive layer and a soft magnetic layer which are laminated through a nonmagnetic layer, and the thin film conductor layer formed on either side of the laminate.

In the present invention, the thin film conductor layer is preferably exposed from a surface opposite to a recording medium.

The present invention further provides a method of producing a thin film conductor layer, comprising depositing the thin film conductor layer on a substrate in a DC magnetron sputtering apparatus with DC bias supplied to the substrate side.

In the present invention, the crystal face spacing of the thin film conductor layer in the direction perpendicular to the film plane thereof is adjusted by the voltage value of the DC bias.

In a conventional conductor layer (thin film conductor layer) formed in, for example, a magnetoresistive element, tensile stress is applied thereto, readily causing separation of the conductor layer. Therefore, in the present invention, the crystal face spacing of the conductor layer is appropriately adjusted to apply compression stress to the conductor layer.

As a result of examination of the relation between stress and the crystal face spacing of a metallic material used for a conductor layer in the direction perpendicular to the film plane thereof, the inventors found that the stress applied to the conductor layer changes from tensile stress to compression stress with increases in the crystal face spacing. Particularly, it was found from experiment that the crystal face spacing with which tensile stress is transferred to compression stress is the same as the crystal face spacing of a bulk material made of the metallic material in the direction perpendicular to the film plane thereof. In the present invention, therefore, the crystal face spacing of the conductor layer comprising a thin film in the direction perpendicular to the film plane thereof is not less than the crystal face spacing of a bulk material in the direction perpendicular to the film plane thereof.

Although, in a conventional element, a soft metallic material such as Au or the like is used for the main conductor layers 9 shown in FIG. 9, such a metallic material causes "sagging" when exposed from a surface opposite to a recording medium, thereby causing a danger of a short circuit. In the present invention, therefore, a hard metallic material such as Cr is preferably used in place of a soft metallic material such as Au, so that the danger of causing "sagging" can be prevented.

As a method of forming a conductor layer comprising a thin film in which the crystal face spacing in the direction perpendicular to the film plane is not less than the crystal face spacing of a bulk material, the crystal face spacing of the thin film conductor layer can be increased by applying a DC bias to the substrate side in the magnetron sputtering apparatus used.

DESCRIPTION OF THE PREFERRED EMBODIMENT

Figure 1:
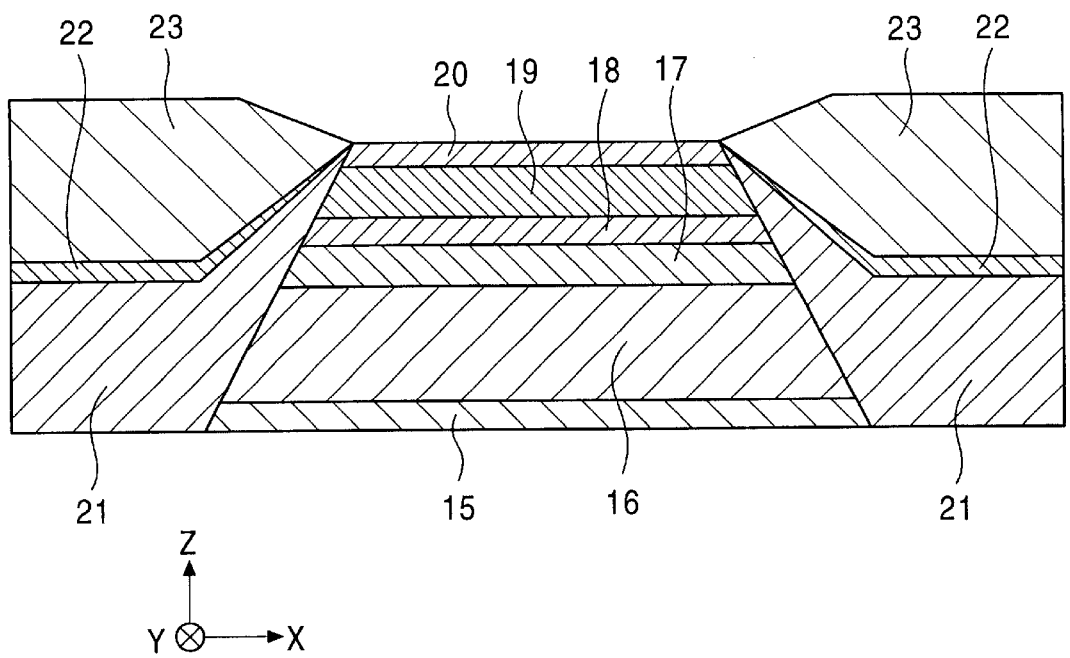
FIG. 1 is a sectional view of a magnetoresistive element (spin-valve type thin film element) in accordance with a first embodiment of the present invention as viewed from the side opposite to a recording medium.

FIG. 1 is a sectional view showing the structure of a spin-valve type thin film element in accordance with a first embodiment of the present invention as viewed from the side opposite to a recording medium.

The spin-valve type thin film element is provided at the trailing side end of a floating slider provided on a hard disk device, for sensing a record magnetic field of a hard disk. A magnetic recording medium such as a hard disk or the like is moved in the Z direction, and a leakage magnetic field in the Y direction is supplied from the magnetic recording medium.

In FIG. 1, the lowermost layer is an under layer 15 made of a nonmagnetic material such as Ta (tantalum) or the like. An antiferromagnetic layer 16, a pinned magnetic layer 17, a nonmagnetic conductor layer 18, and a free magnetic layer 19 are laminated on the under layer 15. A protective layer 20 of Ta is formed on the free magnetic layer 19.

The antiferromagnetic layer 16 may be made of a material conventionally used as antiferromagnetic material, for example, such as an NiMn alloy film, or the like. However, in the present invention, it is preferable to use an antiferromagnetic material comprising a platinum group element, such as a PtMn alloy film or the like, which has a high blocking temperature and produces a high exchange coupling magnetic field in the interface with the pinned magnetic layer. The pinned magnetic layer 17 and the free magnetic layer 19 comprise, for example, a NiFe alloy film, a CoFe alloy film, a Co film, CoNiFe alloy film or a CoNi alloy film. The nonmagnetic conductive layer 18 comprises a Cu film or the like.

The pinned magnetic layer 17 and the antiferromagnetic layer 16 are formed in contact with each other so that magnetization of the pinned magnetic layer 17 is pinned in the Y direction shown in FIG. 1 by an exchange coupling magnetic field produced in the interface with the antiferromagnetic layer 16.

As shown in FIG. 1, hard magnetic bias layers 21 are formed on both sides of a laminate ranging from the under layer 15 to the protective layer 20. The hard magnetic bias layers 21 are made of, for example, a CoPt alloy or CoCrPt alloy. The hard magnetic bias layers 21 are magnetized, for example, in the X direction shown in FIG. 1 so that magnetization of the free magnetic layer 19 is oriented in the X direction by a bias magnetic field from the hard magnetic bias layers 21.

In the present invention, as shown in FIG. 1, a conductor layer (thin film conductor layer) 23 is formed on each of the hard magnetic bias layer 21 through an under layer 22. The conductor layers 23 are made of a metallic material, and preferably a Cr film.

The conductor layers 23 shown in FIG. 1 are formed so that the crystal face spacing in the direction (the Z direction shown in FIG. 1) perpendicular to the film plane is not less than the crystal face spacing of a bulk material made of the same metallic material as the conductor layers 23 in the direction perpendicular to the film plane thereof. The method of adjusting the crystal face spacing is described later.

In the present invention, since the conductor layers 23 are formed so that the crystal face spacing in the direction perpendicular to the film plane is vertically increased, and thus compression stress is applied in parallel with the film plane. In the deposition of the conductor layers 23 with the compression stress applied, the resultant conductor layers 23 are liable to extend in the direction of the film plane due to repulsion against the compression stress. However, compression stress is applied to the conductor layers 23, which are liable to extend in the direction of the film plane, from the layer below the conductor layers 23. By applying compression stress to the conductor layers 23, the conductor layers 23 are adhered to the lower layer, thereby preventing separation of the conductor layers 23. The application of compression tress to the conductor layers 23 also facilitates the formation of the conductor layers 23 having a predetermined thickness, thereby decreasing a DC resistance (DCR).

As described above, in the present invention, the conductor layers 23 are preferably made of a Cr film. However, the crystal structure of the deposited Cr film is generally bcc structure (body-centered cubic structure), and the (110) crystal face is perpendicular to the film plane. In the present invention, in the conductor layers 23 made of a Cr film, the (110) face spacing is preferably 2.039 angstroms or more. Since a Cr bulk material has a (110) face spacing of 2.039 angstroms, the (110) face spacing of the Cr thin film is controlled to 2.039 angstroms or more to apply compression stress to the Cr film, thereby preventing separation of the Cr film. In addition, Cr is inexpensive, as compared with Au conventionally used for the conductor layers 23. Furthermore, the use of Au for the conductor layers 23 readily causes sagging and thus a recess when the film structure shown in FIG. 1 is exposed to the outside by dry-etching the side opposite to the recording medium. However, Cr is a harder metallic material than Au, and thus the formation of the conductor layers 23 by using the Cr film can prevent "sagging" of the conductor layers 23.

In the present invention, as shown in FIG. 1, the under layers 22 are preferably respectively formed between the hard magnetic bias layers 21 and the conductor layers 23, and the under layers 22 preferably comprise a β-phase Ta film (referred to as a "β-Ta film" hereinafter) in which the (002) crystal face is perpendicular to the film plane. The under layers 22 are formed to a thickness of, for example, about 50 angstroms. By forming the under layer 23 comprising a β-Ta film under each of the conductor layers 23, it is possible to improve the orientation of the conductor layers 23, and decrease the resistivity thereof. For example, without the under layers 22 of β-Ta, the conductor layers 23 comprising a Cr film have a resistivity of about 32 ($\mu\Omega$ cm), while with the under layers 22 of β-Ta formed, the conductor layers 23 comprising a Cr film have a resistivity of about 27 ($\mu\Omega$ cm), thereby decreasing resistivity. The under layers 22 comprising a β-Ta film also exhibit excellent corrosion resistance, simplifying the production process. Conventionally, in some cases, an α-Ta film is used as a conductor layer, and deposition of the α-Ta film requires introduction of oxygen into an apparatus. However, as in the present invention, when β-Ta is deposited to form the under layers 22, there is no need to introduce oxygen, thereby realizing simplification of the production process.

In the spin-valve type thin film element shown in FIG. 1, a stationary current (sensing current) is supplied to the free magnetic layer 19, the nonmagnetic conductive layer 18 and the pinned magnetic layer 17 from the conductor layers 23, and a magnetic field is applied to these layers from the recording medium in the Y direction to change the magnetization direction of the free magnetic layer 19 from the X direction to the Y direction. At the same time, electrons which move from one of the free magnetic layer 19 and the pinned magnetic layer 17 to the other layer are scattered in the interface between the nonmagnetic conductive layer 18 and the pinned magnetic layer 17, or the interface between the nonmagnetic conductive layer 18 and the free magnetic layer 19 to cause a change in electric resistance. As a result, the voltage is changed to obtain detecting output.

Figure 2:
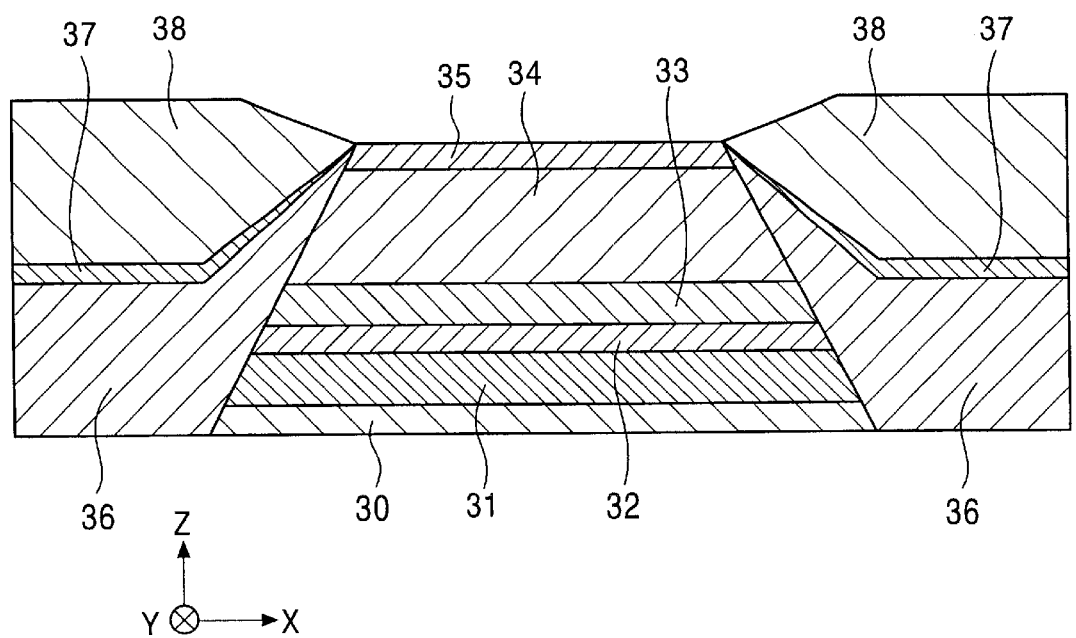
FIG. 2 is a sectional view of a magnetoresistive element (spin-valve type thin film element) in accordance with a second embodiment of the present invention as viewed from the side opposite to a recording medium.

FIG. 2 is a sectional view of a spin-valve type thin film element in accordance with a second embodiment of the present invention as viewed from the side opposite to a recording medium.

The spin-valve type thin film element comprises a film structure comprising an under layer 30, a free magnetic layer 31, a nonmagnetic conductive layer 32, a pinned magnetic layer 33, an antiferromagnetic layer 34, and a protective layer 35, which are formed in this order from below to form a laminate (referred to as "spin valve films" hereinafter) ranging from the under layer 30 to the protective layer 35; and a hard magnetic bias layer 36, an under layer 37 and a conductor layer 38 which are deposited on either side of the laminate.

Like in the conductor layers 32 of the spin-valve type thin film element shown in FIG. 1, in the spin valve type thin film element shown in FIG. 2, the conductor layers 38 are formed so that the crystal face spacing in the direction (the Z direction shown in the drawing) perpendicular to the film plane is not less than the crystal face spacing of a bulk material in the direction perpendicular to the film plane thereof, and compression stress is thus applied to the deposited conductor layers 38. Therefore, the conductor layers 38 are adhered to the under layers, preventing separation of the conductor layers 38.

The conductor layers 38 preferably comprise a Cr film, and the (110) face spacing in the direction perpendicular the film plane is preferably 2.039 angstroms or more.

In the present invention, as shown in FIG. 2, the under layers 37 comprising a β-Ta film preferably respectively formed between the hard magnetic bias layers 36 and the conductor layers 38. By forming the under layers 37 under the conductor layers 38, it is possible to improve the orientation of the conductor layers 38, and decrease the resistivity of the conductor layers 38.

Figure 3:
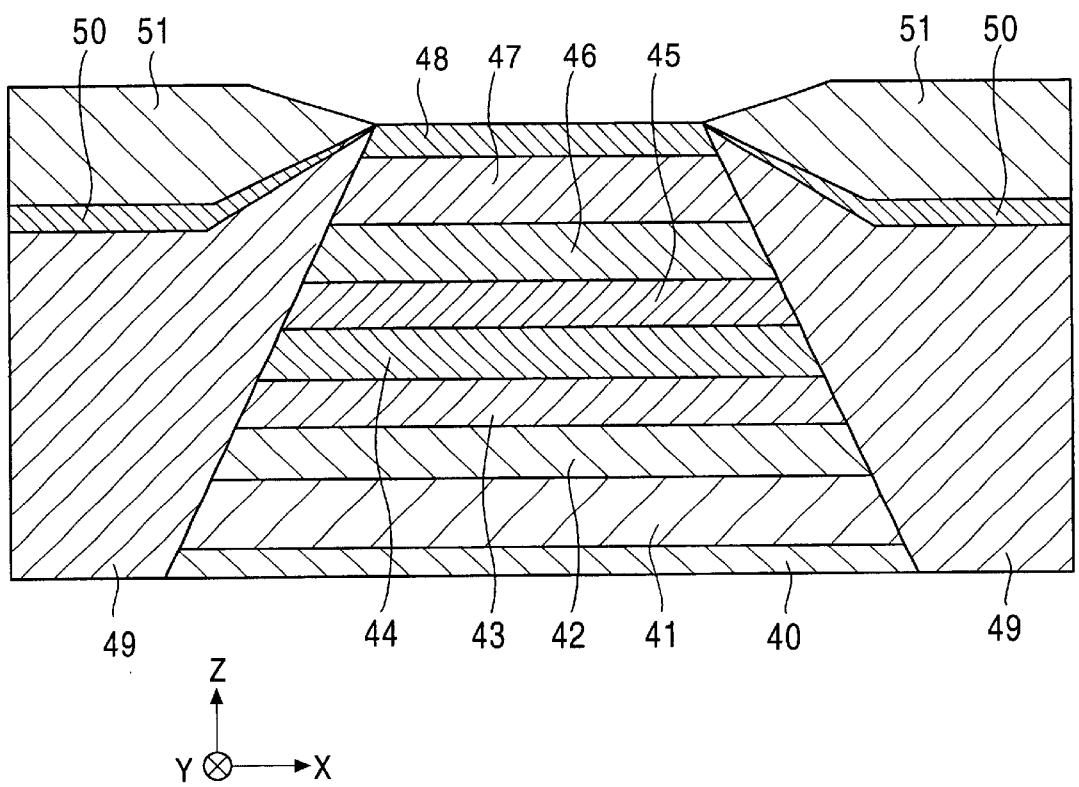
FIG. 3 is a sectional view of a magnetoresistive element (spin-valve type thins film element) in accordance with a third embodiment of the present invention as viewed from the side opposite to a recording medium.

FIG. 3 is a sectional view of a spin-valve type thin film element in accordance with a third embodiment of the present invention as viewed from the side opposite to a recording medium.

The spin-valve type thin film element is referred to as a dual spin-valve type thin film element, and permits the achievement of a high rate of change in resistance, as compared with the spin-valve type thin film elements (single spin-valve type thin film elements) respectively shown in FIGS. 1 and 2.

The spin-valve type thin film element shown in FIG. 3 has a film structure comprising an under layer 40, an antiferromagnetic layer 41, a pinned magnetic layer 42, a nonmagnetic conductive layer 43, a free magnetic layer 44, a nonmagnetic conductive layer 45, a pinned magnetic layer 46, an antiferromagnetic layer 47 and a protective layer 48, which are deposited in this order from below. A hard magnetic bias layer 49, an under layer 50 and a conductor layer 51 are deposited on both sides of a laminate ranging from the under layer 40 to the protective layer 48.

In the spin-valve type thin film element shown in FIG. 3, the conductor layers 51 are formed so that the crystal face spacing in the direction (the Z direction shown in the drawing) perpendicular to the film plane is not less than the crystal face spacing of a bulk material of a metallic material, which forms the conductor layers 51, in the direction perpendicular to the film plane thereof, and compression stress is applied to the deposited conductor layers 51. Therefore, the conductor layers 51 are adhered to the under layers, preventing separation of the conductor layers 51.

The conductor layers 51 are preferably made of a Cr film, and the (110) face spacing in the direction perpendicular to the film plane is preferably 2.039 angstroms or more.

In the present invention, as shown in FIG. 3, the under layers 50 made of a β-Ta film are preferably respectively formed between the hard magnetic bias layers 49 and the conductor layers 51. By forming the under layers 50 below the conductor layers 51, it is possible to improve the orientation of the conductor layers 51 and decrease the resistivity of the conductor layers 51.

Figure 4:
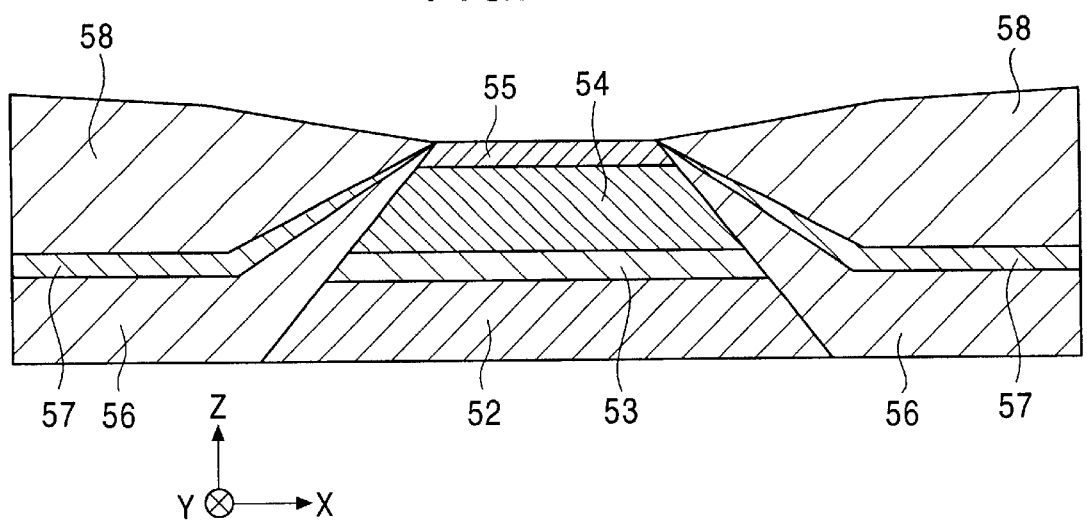
FIG. 4 is a sectional view of a magnetoresistive element (AMR element) in accordance with a fourth embodiment of the present invention as viewed from the side opposite to a recording medium.

FIG. 4 is a sectional view of an AMR (anisotropic magnetoresistive) element for detecting a recording magnetic field from a recording medium, as viewed from the side opposite to the recording medium.

The AMR element comprises a soft magnetic layer (SAL layer) 52, a nonmagnetic layer (SHUNT layer) 53, a magnetoresistive layer (MR layer) 54, and a protective layer 55, which are deposited in this order from below to form a laminate; and hard magnetic bias layers 56 formed on both sides of the laminate. A NiFeNb alloy film, a Ta film, a NiFe alloy film, and a CoPt alloy film are generally used for the soft magnetic layer 52, the nonmagnetic layer 53, the magnetoresistive layer 54 and the hard magnetic bias layer 56, respectively.

In the AMR element shown in FIG. 4, conductor layers 58 are respectively formed on the hard magnetic bias layers 56 through under layers 57. Like the conductor layers of the spin-valve type thin film elements shown in each of FIGS. 1 to 3, the conductor layers 58 are formed so that the crystal face spacing in the direction (the Z direction shown in the drawing) perpendicular to the film plane is not less than the crystal face spacing of a bulk material of a metallic material, which forms the conductor layers 58, in the direction perpendicular to the film plane thereof, and the conductor layers 58 have the compression stress applied thereto. Therefore, the conductor layers 58 are adhered to the under layers, preventing separation of the conductor layers 58.

The conductor layers 58 are preferably made of a Cr film, and the (110) face spacing in the direction perpendicular to the film plane is preferably 2.039 angstroms or more.

In the present invention, as shown in FIG. 4, the under layers 57 made of a β-Ta film are preferably respectively formed between the hard magnetic bias layers 56 and the conductor layers 58. By forming the under layers 57 below the conductor layers 58, it is possible to improve the orientation of the conductor layers 58 and decrease the resistivity of the conductor layers 58.

In the AMR element, the hard magnetic bias layers 56 are magnetized in the X direction shown in FIG. 4 to apply a bias magnetic field in the X direction to the magnetoresistive layer 54 from the hard magnetic bias layers 56. In addition, a bias magnetic filed in the Y direction shown in the drawing is applied to the magnetoresistive layer 54 from the soft magnetic layer 52. By applying the bias magnetic fields in the X and Y directions to the magnetoresistive layer 54, the magnetoresistive layer 54 is set to a state in which magnetization linearly changes with changes in magnetic field.

A sensing current from the conductor layers 58 is supplied to the magnetoresistive layer 54. When the recording medium is moved in the Z direction, and a leakage magnetic field in the Y direction is supplied from the recording medium, the direction of magnetization of the magnetoresistive layer 54 is changed to change the resistance value, and the change in resistance is detected as a change in voltage.

Description will be made of the method of manufacturing the spin-valve type thin film elements respectively shown in FIGS. 1 to 3, and the AMR element shown in FIG. 4.

The films of the magnetoresistive element shown in each of FIGS. 1 to 4 are deposited by sputtering or vapor deposition. As a sputtering apparatus, an exciting apparatus may be used, and particularly a DC magnetron sputtering apparatus is used in the present invention. The DC magnetron sputtering apparatus can easily form each of the layers of the magnetoresistive elements to a predetermined thickness, and exhibits excellent thickness reproducibility, as compared with other sputtering apparatuses.

Figure 5:
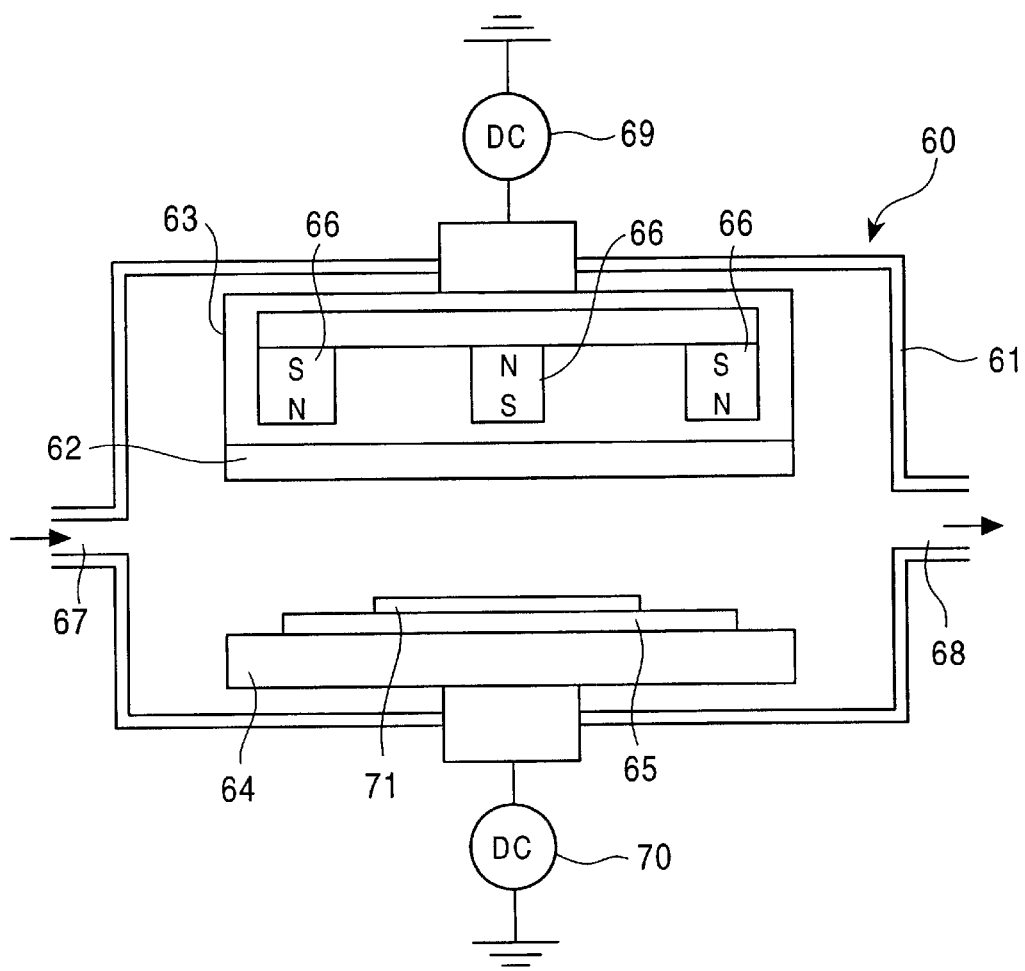
FIG. 5 is a drawing showing the configuration of a DC magnetron sputtering apparatus used in the present invention.

FIG. 5 is a drawing showing the configuration of the internal structure of the DC magnetron sputtering apparatus used in the present invention.

As shown in FIG. 5, a magnetron sputtering apparatus 60 comprises a chamber 61 in which an electrode unit 63 for mounting a target 62, and a substrate support unit 64 opposite to the target 62 are provided. A substrate 65 is mounted on the substrate support unit 64. Also, electrodes 66 are provided in the electrode unit 63. Further, a gas inlet 67 and a gas discharge port 68 are provided in the change 61 so that an Ar gas is introduced through the gas inlet 67.

As described above, in some cases, an α-Ta film is used for the conductor layers of a magnetoresistive element. In this case, it is necessary to introduce an Ar gas as well as O (oxygen) in an amount appropriately adjusted through the gas inlet 67. On the other hand, the present invention uses the same Ta for the under layers interposed between the conductor layers and the hard magnetic bias layers, but uses a β-Ta film. Therefore, only an Ar gas is introduced through the gas inlet 67, thereby realizing simplification of the manufacturing process.

As shown in FIG. 5, a DC power source 69 is connected to the electrode unit 63 so that when the DC power source 69 is operated, magnetron discharge is produced due to interaction between an electric field and a magnetic field. As a result, the target 62 is sputtered to deposit a laminate 71 on the substrate 65 arranged opposite to the target 62.

In the present invention, a DC power source 70 is also connected to the substrate side. In deposition of conductor layers of the laminate 71 on the substrate 65, the DC power source 70 on the substrate side is operated to scratch the surface of the deposited conductor layer by reverse sputtering. The reverse sputtering causes crystal interstitial strain in the conductor layers, increasing the crystal face spacing in the direction perpendicular to the film plane.

In the present invention, it is found from experiment that the crystal face spacing of the conductor layers can be increased by intensifying the DC bias supplied to the substrate side from the DC power source 70. Therefore, the strength of the DC bias must be adjusted so that the crystal face spacing of the conductor layers in the direction perpendicular to the film plane thereof is larger than the crystal face spacing of a bulk material in the direction perpendicular to the film plane thereof.

After the films of the magnetoresistive element shown in each of FIGS. 1 to 4 are deposited, the side opposite to the recording medium is scratched by dry etching to expose the layers of the magnetoresistive element. In the present invention, since the conductor layers are made of, for example, a Cr film, there is no possibility of causing "sagging" in the Cr film when the conductor layers are exposed to the outside, thereby preventing the occurrence of a recess.

As described above, in the present invention, the conductor layers are formed on the hard magnetic bias layers so that the crystal face spacing in the direction perpendicular to the film plane is larger than the crystal face spacing of a bulk material in the direction perpendicular to the film plane thereof, thereby applying compression stress to the conductor layers. It is thus prevent separation of the conductor layers, and form the conductor layers to an appropriate thickness.

In the present invention, particularly, the under layers of a β-Ta film are preferably formed between the hard magnetic bias layers and the conductor layers. By forming the under layers below the conductor layers, it is possible to improve the orientation of the conductor layers, and decrease the resistivity of the conductor layers.

In order to adjust the crystal face spacing of the conductor layers, the DC power source is also connected to the substrate side in the existing DC magnetron sputtering apparatus so that the crystal face spacing of the conductor layers can easily be increased by supplying a DC bias to the substrate side.

Although the thin film conductor layers of a magnetoresistive element have been described with reference to the embodiments of the present invention, the present invention can also be applied to conductor layers of a semiconductor DRAM and the like.

EXAMPLES

In the present invention, a Cr film was actually deposited on a substrate in a DC magnetron sputtering apparatus to examine the relation between the strength of the DC bias supplied to the substrate side and the stress applied to the Cr film, and the relation between the strength of the DC bias and the (110) face spacing of the Cr film.

Before the Cr film was deposited on the substrate, an under layer made of a β-Ta film was deposited.

Figure 6:
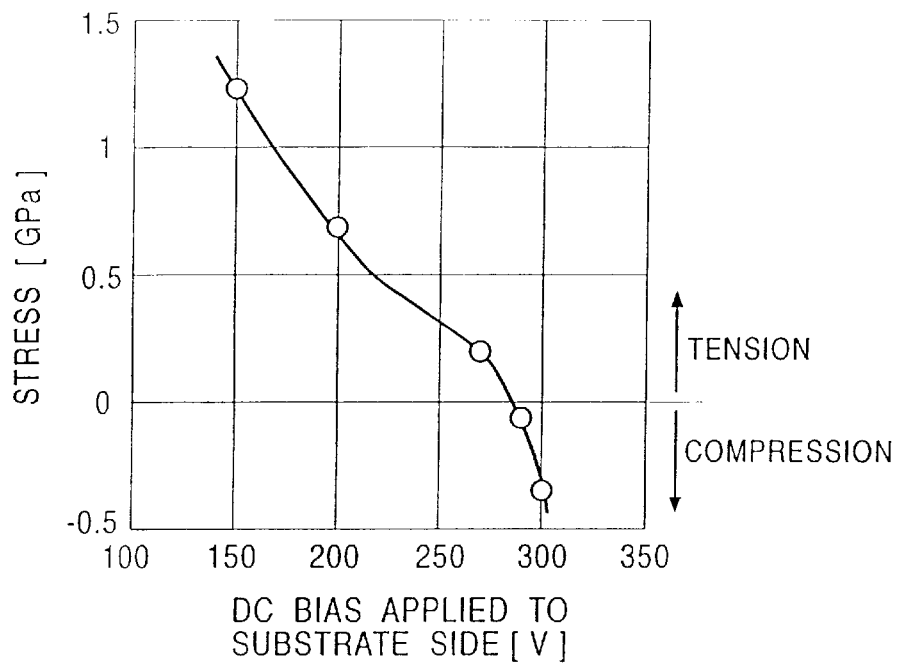
FIG. 6 is a graph showing the relation between the strength of the DC bias applied to the substrate side in a DC magnetron sputtering apparatus and the stress applied to a conductor layer (Cr film)

The relation between the strength of the DC bias supplied to the substrate side and the stress applied to a conductor layer (Cr film) is described with reference to FIG. 6. In FIG. 6, "stress" shown on the ordinate represents the stress applied in parallel with the film plane of the conductor layer.

FIG. 6 shows that the stress applied to the conductor layer changes from a plus value to a minus value as the DC bias increases. The stress on the plus side means that tensile stress is applied to the conductor layer, and stress on the minus side means that compression stress is applied to the conductor layer. It is thus found that compression stress can be applied to the conductor layer by increasing the Dc bias.

Figure 7:
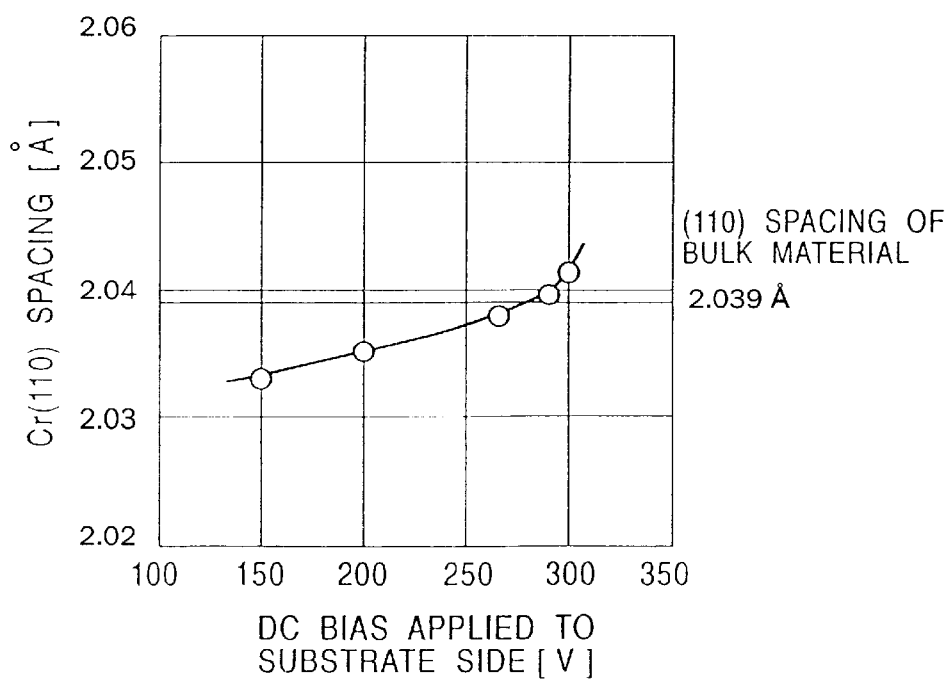
FIG. 7 is a graph showing the relation between the strength of the DC bias applied to the substrate side in a DC magnetron sputtering apparatus and the (110) face spacing of a conductor layer (Cr film)

FIG. 7 is a graph showing the relation between the strength of the DC bias supplied to the substrate side and the (110) face spacing of the Cr film. The Cr film has a bcc crystal structure, and the (110) crystal face is perpendicular to the film plane thereof.

FIG. 7 indicates that the (110) face spacing of the Cr film can be gradually increased by increasing the Dc bias. It is found that the (110) face spacing of a bulk material of Cr is 2.039 angstroms.

It is thus found that in order to make the (110) face spacing of the Cr film larger than the (110) face spacing (=2.039 angstroms) of a bulk material, a DC bias of about 280 (V) or more is preferably supplied.

A graph was formed on the basis of FIGS. 6 and 7, in which the (110) face spacing of the Cr film was shown on the abscissa, and film stress was shown on the ordinate. The results are shown in FIG. 8.

Figure 8:
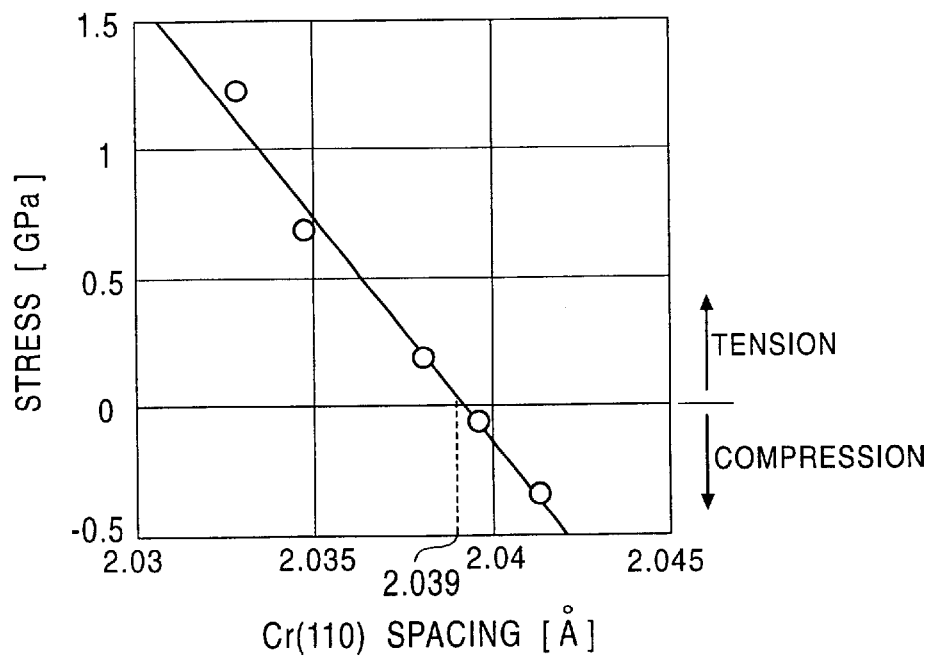
FIG. 8 is a graph showing the relation between the (110) face spacing of a conductor layer (Cr film) and the film stress applied to the Cr film.
Figure 9:
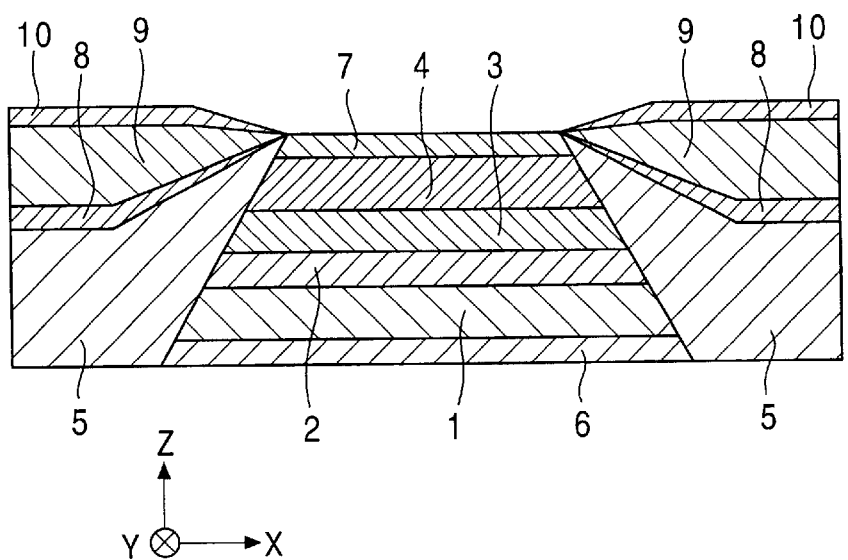
FIG. 9 is a sectional view of a conventional magnetoresistive element (spin-valve type thin film element) as viewed from the side opposite to a recording medium.

FIG. 8 indicates that the film stress applied to the Cr film changes from plus to minus, i.e., from tensile stress to compression stress, as the (110) face spacing of the Cr film increases.

As described above, in the case of the bulk material, the (110) face spacing is 2.039 angstroms. However, as shown in FIG. 8, the film stress can be made zero (Gpa) when the (110) face spacing of the Cr film is 2.039 angstroms, and compression stress can be applied to the Cr film when the (110) face spacing is 2.039 angstroms or more.

In the present invention, therefore, the crystal face spacing of a metallic material, which constitutes the conductor layers, in the direction perpendicular to the film plane thereof is not less than the crystal face spacing of a bulk material in the direction perpendicular to the film plane thereof. This permits application of compression stress to the conductor layers, and prevention of separation of the conductor layers.

As described above, in the present invention, the conductor layers comprising thin films are formed by using a metallic material so that the crystal face spacing in the direction perpendicular to the film plane thereof is not less than the crystal face spacing of a bulk material, to apply compression stress to the conductor layers, thereby preventing separation of the conductor layers. By applying compression stress to the conductor layers, the conductor layers can easily be formed to a predetermined thickness.

In the present invention, particularly, the conductor layers preferably comprise Cr films. The Cr films have a bcc crystal structure, and the (110) crystal face thereof is perpendicular to the film plane. However, in the present invention, the (110) face spacing is 2.039 angstroms or more so that compression stress is applied to the Cr films, thereby preventing separation of the Cr films. By forming the conductor layers comprising Cr films, it is possible to prevent "sagging" and the occurrence of a recess. Also the Cr films are inexpensive, as compared with Au films conventionally used for conductor layers.

In the present invention, the under layers are preferably formed below the conductor layers. By forming the under layers, it is possible to improve the orientation of the conductor layers, and decrease the resistivity of the conductor layers. In addition, the under layers are preferably made of a β-Ta film which has excellent corrosion resistance. When an α-Ta film is used for conductor layers, the step of appropriately adjusting the amount of O (oxygen) introduced into the sputtering apparatus is required. However, the deposition of a β-Ta film requires no oxygen, and can thus simplify the process, as compared with conventional manufacturing processes.

What is claimed is:

1. A method of producing a thin film conductor layer having an increase lattice facing of the thin film conductor layer, and decreased film stress to prevent peeling of the thin film conductor layer, said method comprising the step of depositing a thin film conductor layer on a substrate in a DC magnetron sputtering apparatus, wherein the substrate is held by a substrate supporting member and the thin film conductor layer is deposited by operating a first DC electrode acting on a target made of a metallic material, and a second DC electrode electrically connected to the substrate is operated to inversely sputter the surface of the thin film conductor, to produce a thin film conductor layer comprising bcc-structure Cr and having a (110) crystal face spacing of 2.039 angstroms or more in the direction perpendicular to the film plane.

2. A method of producing a thin film conductor layer according to claim 1, wherein the crystal face spacing of the thin film conductor layer in the direction perpendicular to the film plane is adjusted by the bias voltage value of the second DC electrode.

3. A method of producing a thin film conductor layer according to claim 1, wherein an under layer is formed on the lower side of the thin film conductor layer.

4. A method of producing a thin film conductor layer according to claim 1, wherein the under layer comprises β-phase Ta having the (002) crystal face perpendicular to the film plane thereof.

5. A method of producing a thin film conductor layer according to claim 1, wherein the DC bias of the second DC electrode is 280 V or more.

6. A method of producing a magnetoresistive element comprising a laminate and a thin film conductor layer formed on either side of the laminate in the direction parallel to the film plane, said laminate comprising an antiferromagnetic layer, a pinned magnetic layer formed in contact with the antiferromagnetic layer so that the direction of magnetization is pinned by an exchange coupling magnetic field with the antiferromagnetic layer, and a nonmagnetic conductive layer formed between the pinned magnetic layer and a free magnetic layer, said thin film conductor layer having an increased lattice facing of the thin film conductor layer, and decreased film stress to prevent peeling of the thin film conductor layer, said method comprising the step of depositing a thin film conductor layer on a substrate in a DC magnetron sputtering apparatus, wherein the substrate is held by a substrate supporting member and the thin film conductor layer is deposited by operating a first DC electrode acting on a target made of a metallic material, and a second DC electrode electrically connected to the substrate is operated to inversely sputter the surface of the thin film conductor, to produce a thin film conductor layer comprising bcc-structure Cr and having a (110) crystal face spacing of 2.039 angstroms or more in the direction perpendicular to the film plane.

7. A method according to claim 6, wherein an under layer is formed on the lower side of the thin film conductor layer.

8. A method according to claim 7, wherein the under layer comprises β-phase Ta having the (002) crystal face perpendicular to the film plane thereof.

9. A method according to claim 6, wherein the thin film conductor layer is exposed from the side opposite to a recording medium.

10. A method of producing a magnetoresistive element comprising a laminate and a thin film conductor layer formed on either side of the laminate in a direction parallel to the film plane, said laminate comprising a magnetoresistive layer and a soft magnetic layer, both of which are deposited with a nonmagnetic layer therebetween, said thin film conductor layer having an increased lattice facing of the thin film conductor layer, and decreased film stress to prevent peeling of the thin film conductor layer, said method comprising the step of depositing a thin film conductor layer on a substrate in a DC magnetron sputtering apparatus, wherein the substrate is held by a substrate supporting member and the thin film conductor layer is deposited by operating a first DC electrode acting on a target made of a metallic material, and a second DC electrode electrically connected to the substrate is operated to inversely sputter the surface of the thin film conductor, to produce a thin film conductor layer comprising bcc-structure Cr and having a (110) crystal face spacing of 2.039 angstroms or more in the direction perpendicular to the film plane.

11. A method according to claim 10, wherein an under layer is formed on the lower side of the thin film conductor layer.

12. A method according to claim 11, wherein the under layer comprises β-phase Ta having the (002) crystal face perpendicular to the film plane thereof.

13. A method according to claim 10, wherein the thin film conductor layer is exposed from the side opposite to a recording medium.

* * * * *